(12) United States Patent
Adkisson et al.

(10) Patent No.: US 7,492,048 B2
(45) Date of Patent: Feb. 17, 2009

(54) CMOS SENSORS HAVING CHARGE PUSHING REGIONS

(75) Inventors: James William Adkisson, Jericho, VT (US); Jeffrey Peter Gambino, Westford, VT (US); Mark David Jaffe, Shelburne, VT (US); Jeffrey Bowman Johnson, Essex Junction, VT (US); Jerome Brett Lasky, Essex Junction, VT (US); Richard John Rassel, Colchester, VT (US)

(73) Assignee: International Business Machines Corporation, Armonk, NY (US)

( * ) Notice: Subject to any disclaimer, the term of this patent is extended or adjusted under 35 U.S.C. 154(b) by 579 days.

(21) Appl. No.: 11/275,497

(22) Filed: Jan. 10, 2006

(65) Prior Publication Data
US 2007/0158711 A1   Jul. 12, 2007

(51) Int. Cl.
H01L 31/062   (2006.01)
(52) U.S. Cl. .......................... 257/790; 257/233
(58) Field of Classification Search ................. 257/233, 257/290, 292; 250/214.1
See application file for complete search history.

(56) References Cited

U.S. PATENT DOCUMENTS

| | | | |
|---|---|---|---|
| 5,608,243 A * | 3/1997 | Chi et al. | 257/249 |
| 6,063,686 A | 5/2000 | Masuda et al. | |
| 6,252,281 B1 | 6/2001 | Yamamoto et al. | |
| 6,501,109 B1 * | 12/2002 | Chi | 257/223 |
| 7,253,392 B2 * | 8/2007 | Hong et al. | 250/214.1 |
| 2002/0043693 A1 | 4/2002 | Tiwari et al. | |
| 2003/0006446 A1 | 1/2003 | Forbes et al. | |
| 2005/0023530 A1 | 2/2005 | Koyama | |
| 2005/0023615 A1 | 2/2005 | Yano et al. | |
| 2005/0110078 A1 | 5/2005 | Shino | |
| 2005/0121722 A1 | 6/2005 | Oyamatsu | |
| 2007/0131991 A1 * | 6/2007 | Sugawa | 257/292 |

* cited by examiner

*Primary Examiner*—Roy K Potter
(74) *Attorney, Agent, or Firm*—Schmeiser, Olsen & Watts; Anthony J. Canale

(57) ABSTRACT

Structures and method for forming the same. The semiconductor structure comprises a photo diode that includes a first semiconductor region and a second semiconductor region. The first and second semiconductor regions are doped with a first and second doping polarities, respectively, and the first and second doping polarities are opposite. The semiconductor structure also comprises a transfer gate that comprises (i) a first extension region, (ii) a second extension region, and (iii) a floating diffusion region. The first and second extension regions are in direct physical contact with the photo diode and the floating diffusion region, respectively. The semiconductor structure further comprises a charge pushing region. The charge pushing region overlaps the first semiconductor region and does not overlap the floating diffusion region. The charge pushing region comprises a transparent and electrically conducting material.

20 Claims, 16 Drawing Sheets

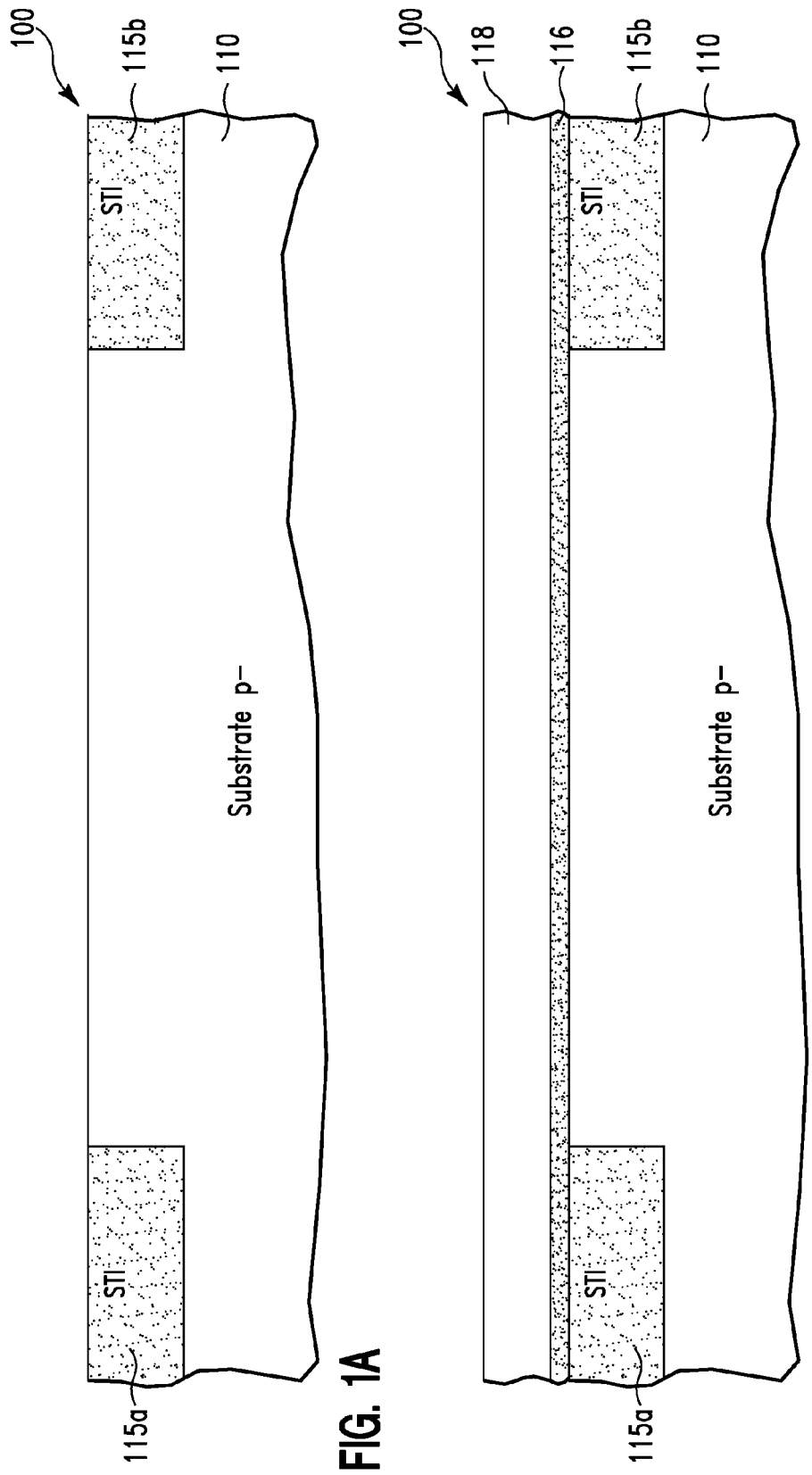

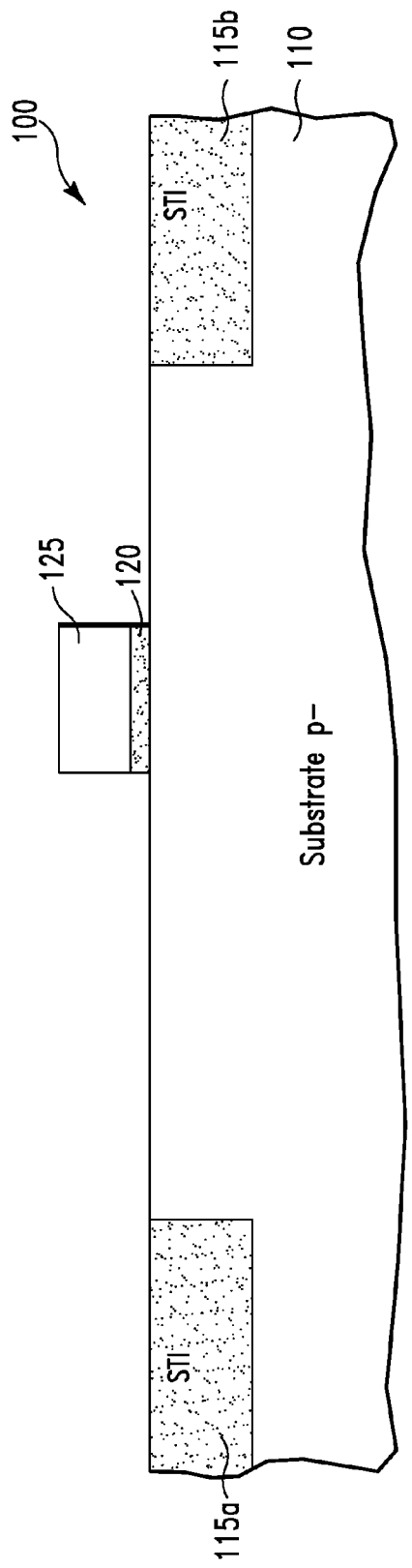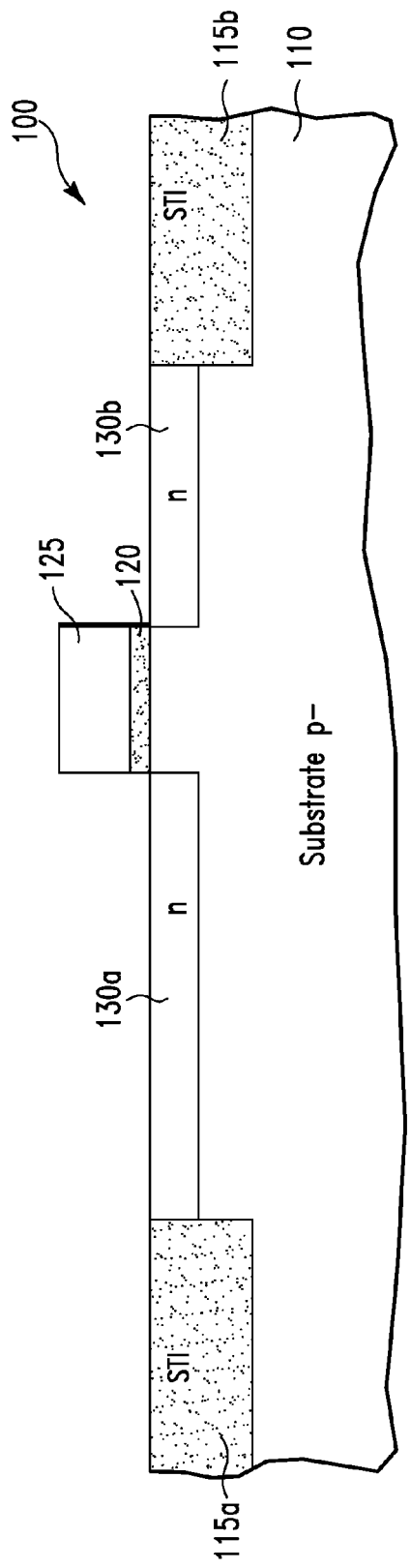

CMOS SENSORS HAVING CHARGE PUSHING REGIONS

BACKGROUND OF THE INVENTION

1. Technical Field

The present invention relates to CMOS (Complementary Metal Oxide Semiconductor) sensors, and more specifically, to the CMOS sensors that have charge pushing regions.

2. Related Art

A typical CMOS sensor comprises a photo diode and a transfer gate. After light is shined on the photo diode, free electrons are created in the photo diode. Then, those free electrons are transferred to a floating diffusion region through the transfer gate. It is desirable to transfer as many free electrons as possible to the floating diffusion region through the transfer gate. Therefore, there is a need for a structure and method to help transfer as many free electrons as possible from the photo diode to the floating diffusion region through the transfer gate.

SUMMARY OF THE INVENTION

The present invention provides a semiconductor structure, comprising (a) a photo diode that includes a first semiconductor region and a second semiconductor region, wherein the first semiconductor region is doped with a first doping polarity, wherein the second semiconductor region is doped with a second doping polarity, and wherein the first and second doping polarities are opposite; (b) a transfer gate that comprises (i) a first extension region, (ii) a second extension region, and (iii) a floating diffusion region, wherein the first extension region is in direct physical contact with the photo diode, and wherein the second extension region is in direct physical contact with the floating diffusion region; and (c) a charge pushing region, wherein the charge pushing region overlaps the first semiconductor region, wherein the charge pushing region does not overlap the floating diffusion region, and wherein the charge pushing region comprises a transparent and electrically conducting material.

The present invention provides a semiconductor structure operation method, comprising providing a semiconductor structure, which comprises (a) a photo diode that includes a first semiconductor region and a second semiconductor region, wherein the first semiconductor region is doped with a first doping polarity, wherein the second semiconductor region is doped with a second doping polarity, and wherein the first and second doping polarities are opposite, (b) a transfer gate that comprises (i) a first extension region, (ii) a second extension region, and (iii) a floating diffusion region, wherein the first extension region is in direct physical contact with the photo diode, and wherein the second extension region is in direct physical contact with the floating diffusion region, and (c) a charge pushing region, wherein the charge pushing region overlaps the first semiconductor region, wherein the charge pushing region does not overlap the floating diffusion region, and wherein the charge pushing region comprises a transparent and electrically conducting material; shining light on the photo diode; turning on the transfer gate; and applying a first voltage to the floating diffusion region of the transfer gate, a second voltage to the second semiconductor region of the photo diode, and a pushing voltage to the charge pushing region so as to help push free electrons from the photo diode to the floating diffusion region through the transfer gate.

The present invention provides a sensor array, comprising (a) a substrate; (b) N sensors on the substrate, wherein the N sensors are arranged in rows and columns, wherein each of the N sensors comprises (i) a photo diode that includes a first semiconductor region and a second semiconductor region, wherein the first semiconductor region is doped with a first doping polarity, wherein the second semiconductor region is doped with a second doping polarity, and wherein the first and second doping polarities are opposite, (ii) a transfer gate that comprises ($\alpha$) a first extension region, ($\beta$) a second extension region, and ($\gamma$) a floating diffusion region, wherein the first extension region is in direct physical contact with the photo diode, and wherein the second extension region is in direct physical contact with the floating diffusion region, and (iii) a charge pushing region, wherein the charge pushing region overlaps the first semiconductor region, wherein the charge pushing region does not overlap the floating diffusion region, and wherein the charge pushing region comprises a transparent and electrically conducting material, (c) a contact contacting to first and second sensors of the N sensors.

The present invention provides a structure and method to help transfer as many free electrons as possible from the photo diode to the floating diffusion region through the transfer gate.

BRIEF DESCRIPTION OF THE DRAWINGS

FIGS. 1A-1M show cross-section views of a CMOS sensor going through different fabrication steps of a fabrication process, in accordance with embodiments of the present invention.

FIGS. 1Ma and 1Mb show top-down views of CMOS sensor arrays 100.1 and 100.2, in accordance with embodiments of the present invention.

FIG. 1Mc shows an operation of the CMOS sensor 100 of FIG. 1M, in accordance with embodiments of the present invention.

DETAILED DESCRIPTION OF THE INVENTION

Figure 1E:
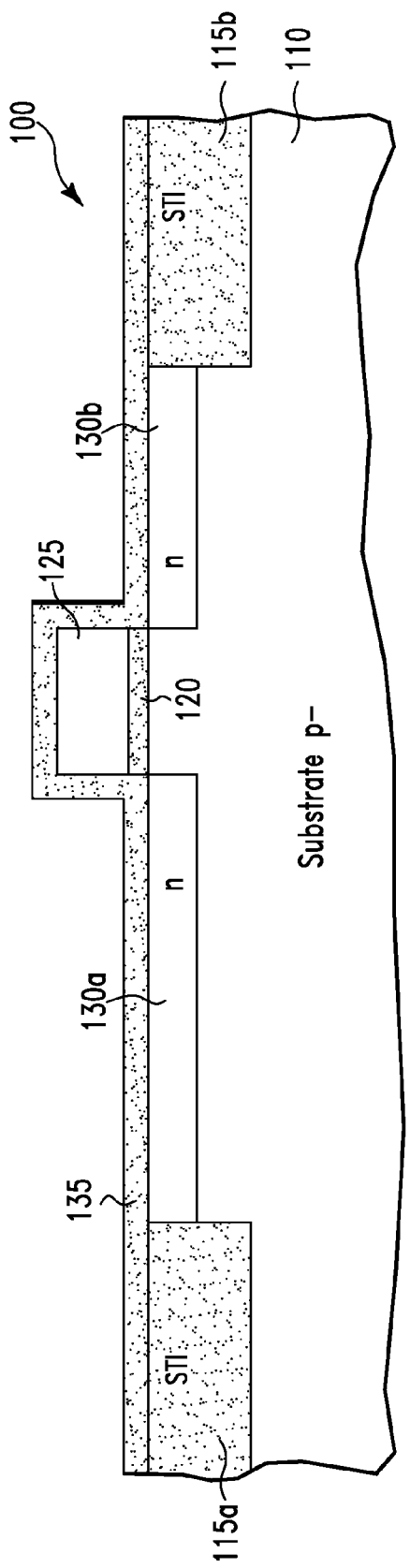

FIGS. 1A-1M show cross-section views of a CMOS (Complementary Metal Oxide Semiconductor) sensor 100 going through different fabrication steps of a fabrication process, in accordance with embodiments of the present invention.

More specifically, in one embodiment, the fabrication process starts out with a p-substrate 110 (i.e., lightly doped with p-type dopants). Next, in one embodiment, STI (Shallow Trench Isolation) regions 115a and 115b are formed in the substrate 110. Illustratively, the STI regions 115a and 115b can be formed by first creating two trenches at the two places where the STI regions 115a and 115b will be formed. Then, a dielectric material such as silicon dioxide is used to fill the two trenches so as to form the STI regions 115a and 115b. Finally, the surface is polished to the original planar surface.

Next, with reference to FIG. 1B, in one embodiment, a gate dielectric layer 116 is formed on top of the substrate 110 and the STI regions 115a and 115b. More specifically, the gate dielectric layer 116 can be formed by thermal oxidation of the silicon on top of the structure 100 of FIG. 1A.

Next, in one embodiment, a poly-silicon layer 118 is formed on top of the gate dielectric layer 116. More specifically, the poly-silicon layer 118 can be formed by CVD of poly-silicon on top of the gate dielectric layer 116. Next, in one embodiment, the gate dielectric layer 116 and the poly-silicon layer 118 are patterned so as to form a gate dielectric region 120 and a gate electrode region 125, respectively, in FIG. 1C. Illustratively, the gate dielectric region 120 and the gate electrode region 125 are formed by using a conventional lithographic and etching process. It should be noted that the gate dielectric region 120 and the gate electrode region 125 can be collectively referred to as a gate stack 120,125.

Next, with reference to FIG. 1D, in one embodiment, the gate stack 120,125 is used as a blocking mask to form extension regions 130a and 130b (i.e., lightly doped with n-type dopants) in the substrate 110 by, illustratively, ion implantation.

Next, with reference to FIG. 1E, in one embodiment, a dielectric layer 135 is formed on top of the structure 100 of FIG. 1D. More specifically, in one embodiment, the dielectric layer 135 is formed by CVD of silicon dioxide on top of the structure 100 of FIG. 1D.

Figure 1F:
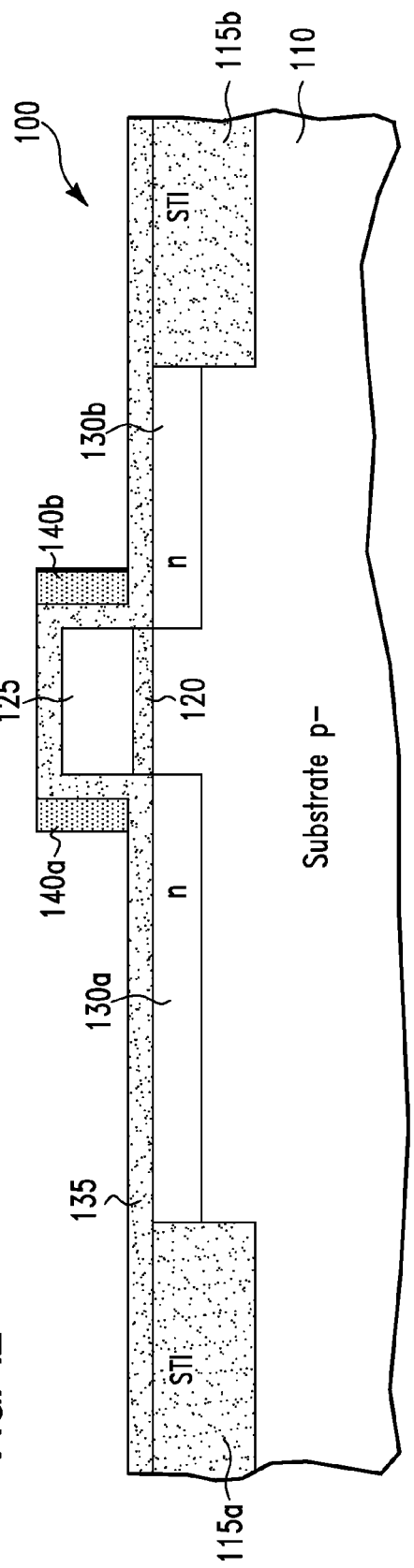

Next, with reference to FIG. 1F, in one embodiment, nitride spacers 140a and 140b are formed on sidewalls of the gate stack 120,125. Illustratively, the nitride spacers 140a and 140b are formed by depositing a nitride material (e.g., silicon nitride) on top of the entire structure 100 of FIG. 1E and then etching back the deposited nitride material, resulting in the nitride spacers 140a and 140b on side walls of the gate stack 120,125.

Figure 1G:
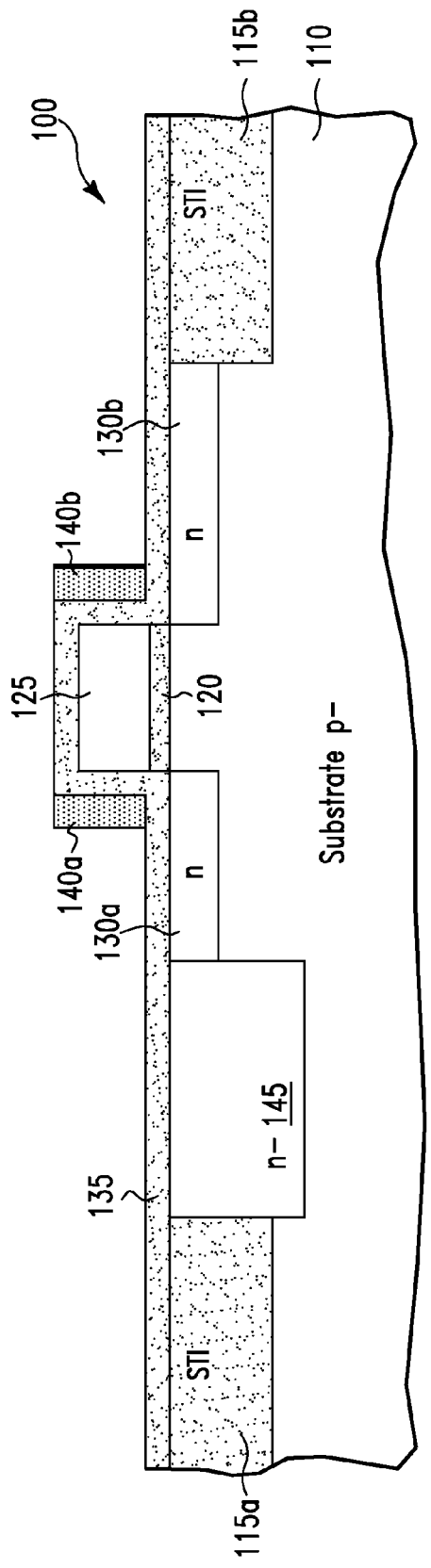

Next, with reference to FIG. 1G, in one embodiment, an n-Si region 145 (i.e., lightly doped with n-type dopants) is formed in the substrate 110 by, illustratively, ion implantation. In one embodiment, the n-Si region 145 is implanted with a doping concentration similar to the doping concentration of the extension regions 130a and 130b and deeper than the extension regions 130a and 130b. The n-Si region 145 and the p-substrate 110 form a PN junction, therefore, can be collectively referred to as a photo diode 110,145.

Figure 1H:
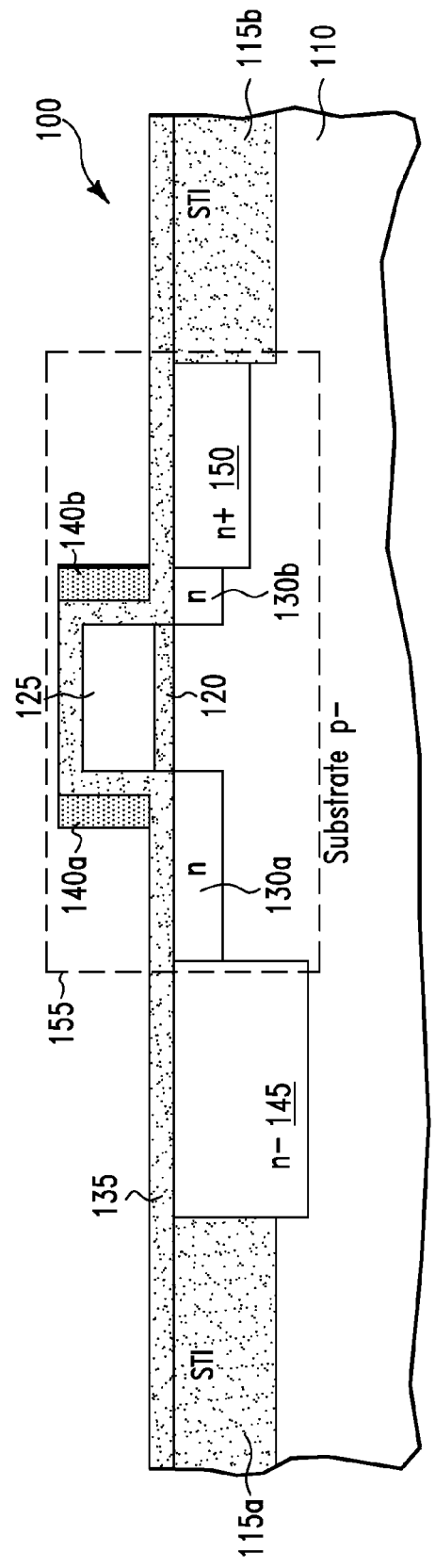

Next, with reference to FIG. 1H, in one embodiment, a drain region 150 is formed in the substrate 110 by, illustratively, ion implantation. In one embodiment, the drain region 150 (also called a floating diffusion region 150) is heavily doped with n-type dopants and deeper than the extension regions 130a and 130b. It should be noted that the gate dielectric region 120, the gate electrode region 125, the extension regions 130a and 130b and the floating diffusion region 150 can be collectively referred to as a transfer gate 155.

Figure 1I:
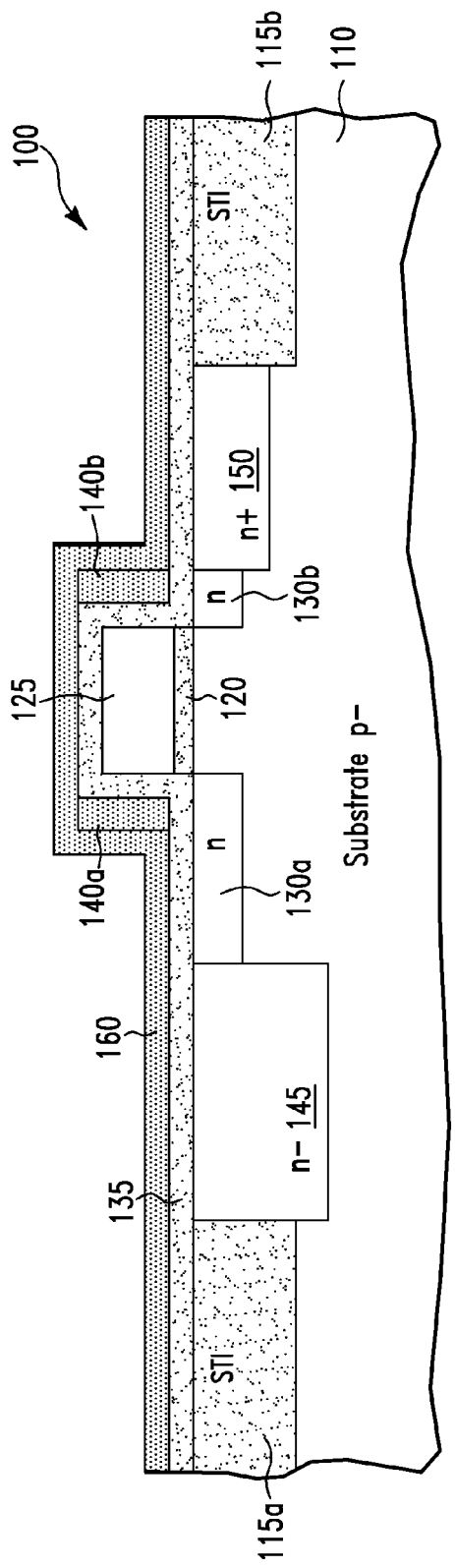

Next, with reference to FIG. 1I, in one embodiment, a nitride layer 160 is formed on top of the structure 100 of FIG. 1H. Illustratively, the nitride layer 160 can be formed by PECVD (Plasma Enhanced Chemical Vapor Deposition) of silicon nitride on top of the dielectric layer 135 and the nitride spacers 140a and 140b.

Figure 1J:
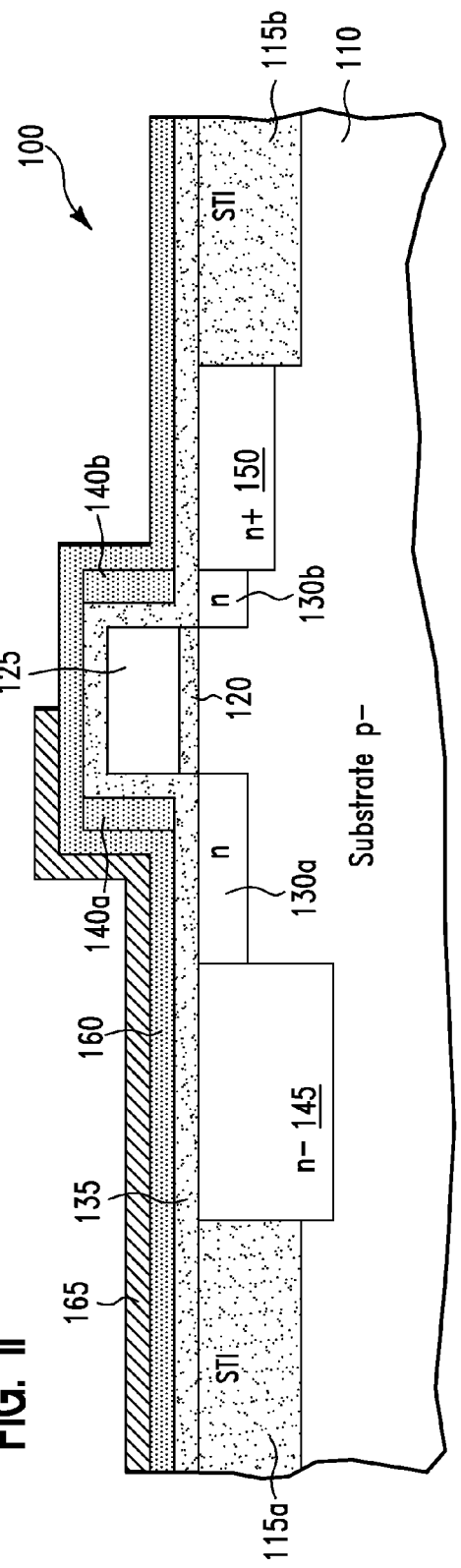

Next, with reference to FIG. 1J, in one embodiment, a charge pushing region 165 is formed by CVD of a transparent and conducting material on top of the nitride layer 160 followed by a lithographic and etching step. The lithographic and etching step is performed such that the charge pushing region 165 is only formed to the left and on top of a part of the gate electrode region 125 as shown in FIG. 1J. In one embodiment, the charge pushing region 165 comprises any material which is transparent and electrically conducting, such as ITO (Indium Tin Oxide—InSnO$_2$).

Figure 1K:
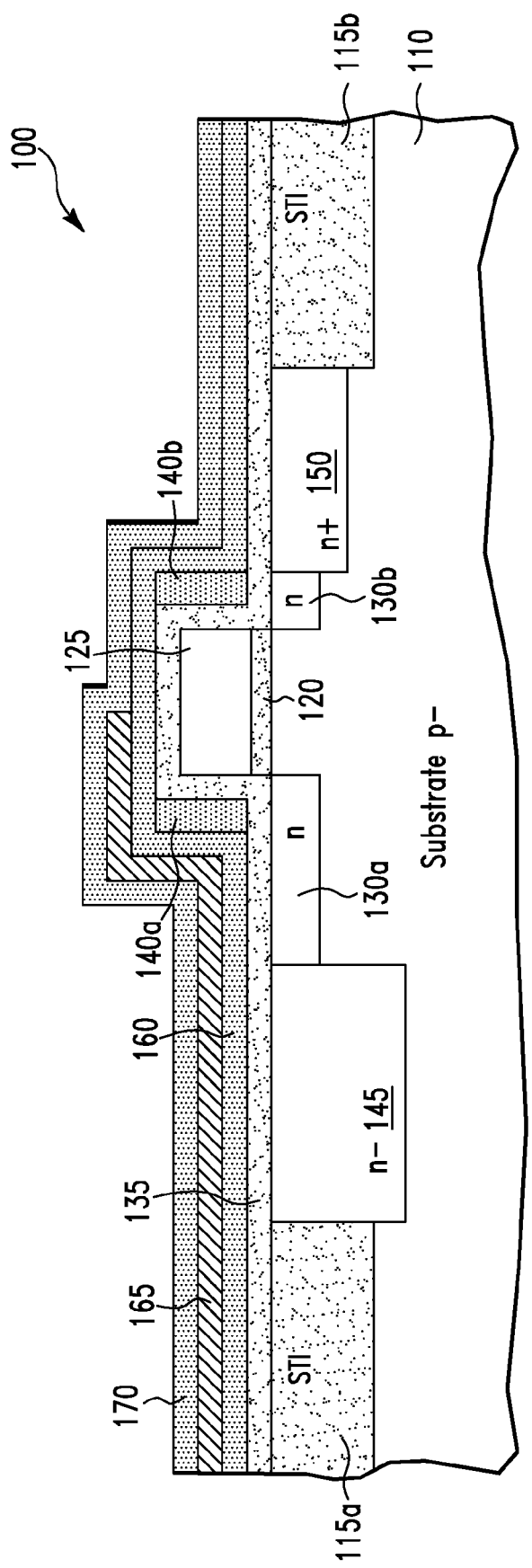

Next, with reference to FIG. 1K, in one embodiment, a nitride layer 170 is formed on top of the structure 100 of FIG. 1J. Illustratively, the nitride layer 170 can be formed by PECVD of silicon nitride on top of the charge pushing region 165 and the exposed nitride layer 160.

Figure 1L:
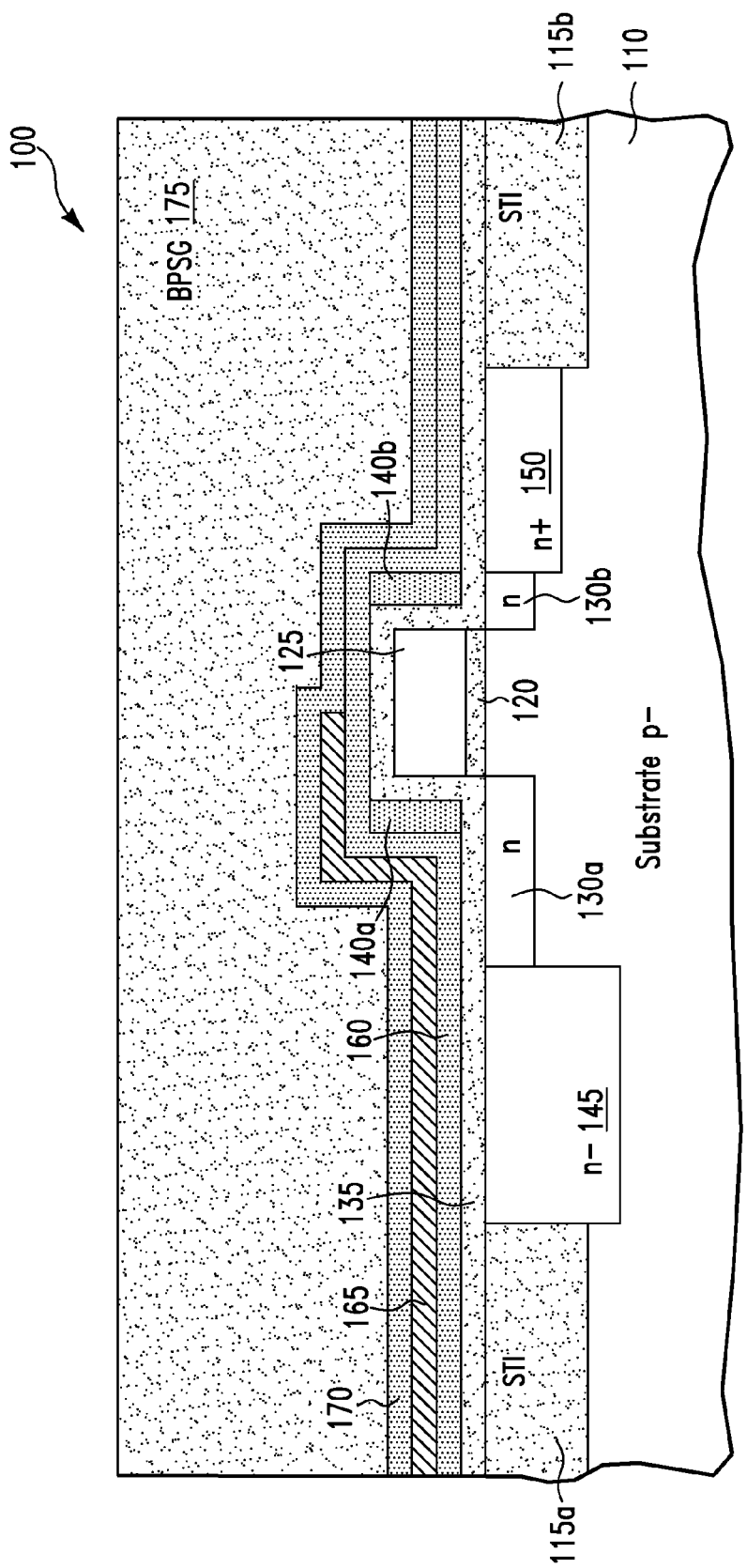

Next, with reference to FIG. 1L, in one embodiment, a BPSG (boro phospho silicate glass) layer 175 is formed on top of the structure 100 of FIG. 1K. More specifically, the BPSG layer 175 can be formed by CVD of BPSG material on top of the nitride layer 170, and then, the top surface of the BPSG layer 175 can be polished by, illustratively, a CMP (chemical mechanical polishing) step. The resulting structure 100 is shown in FIG. 1L.

Figure 1M:
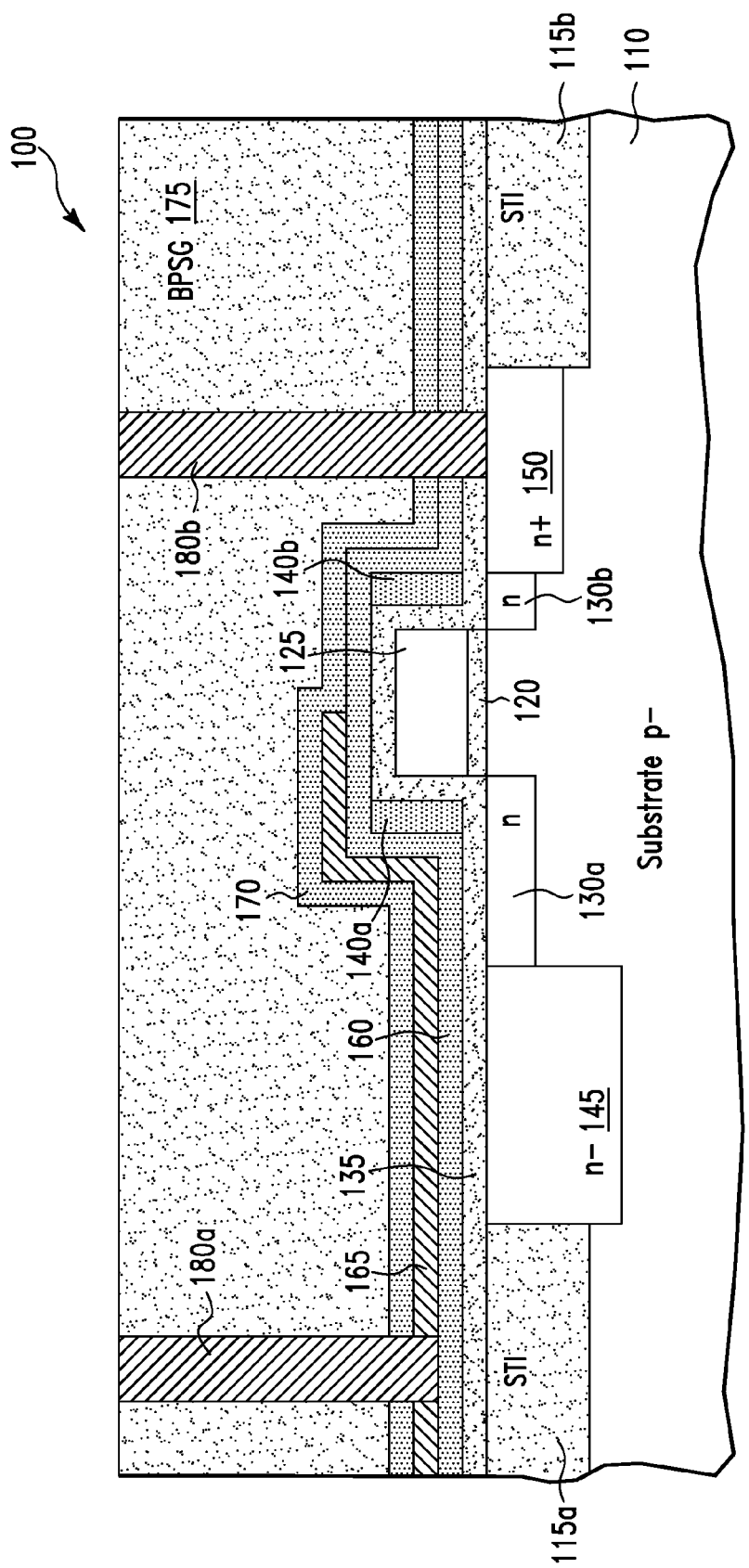
Figure 1M:
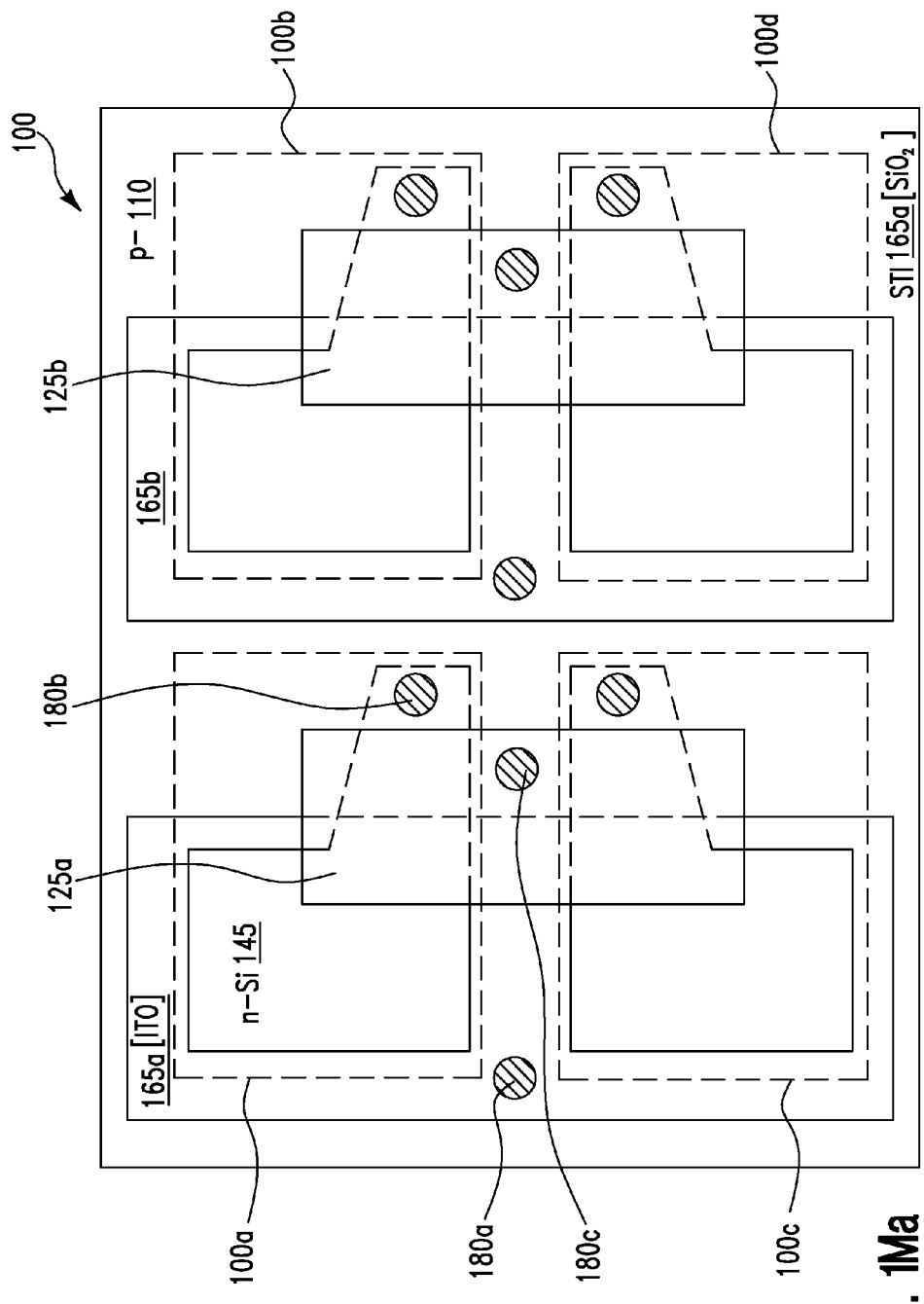
Figure 1M:
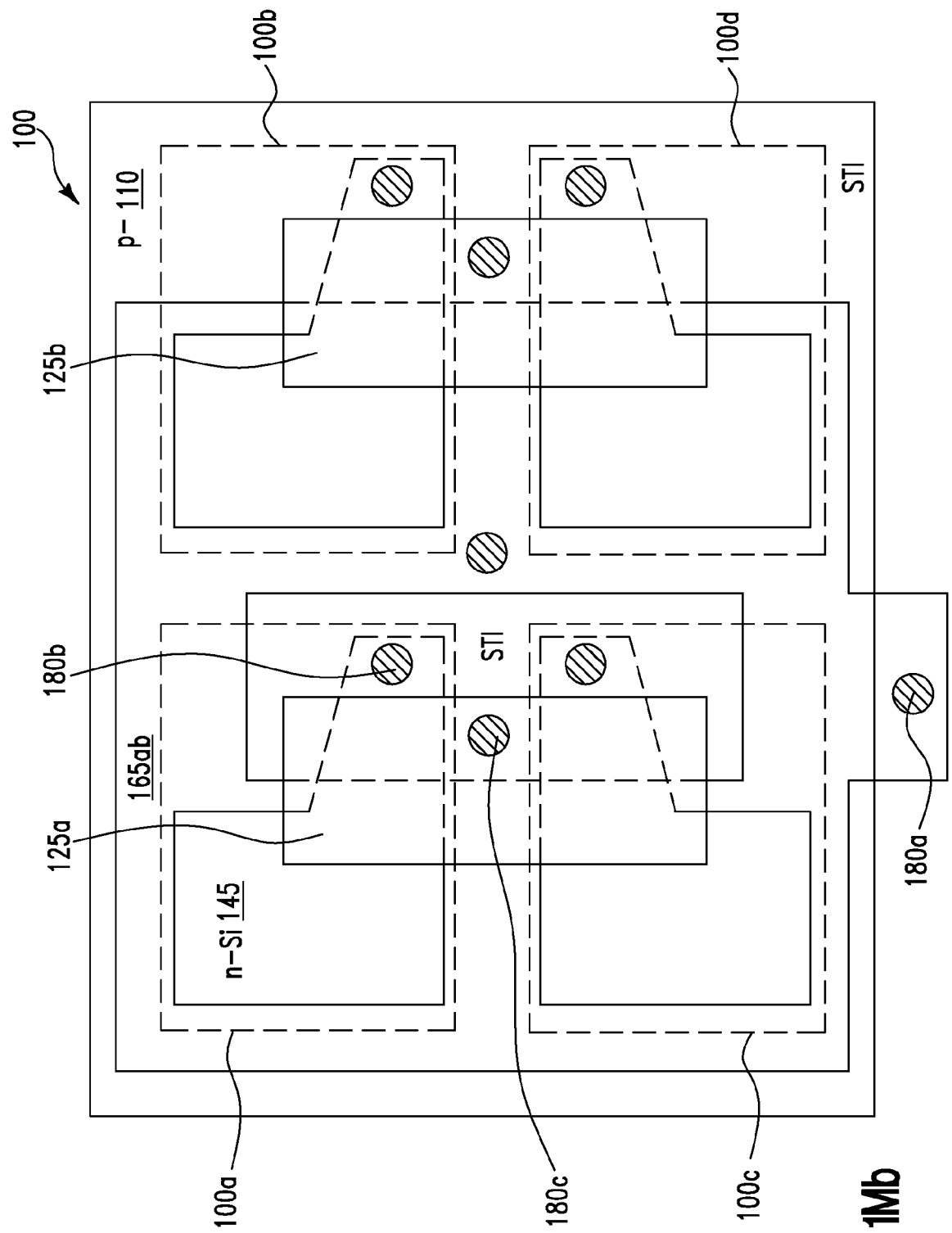
Figure 1M:
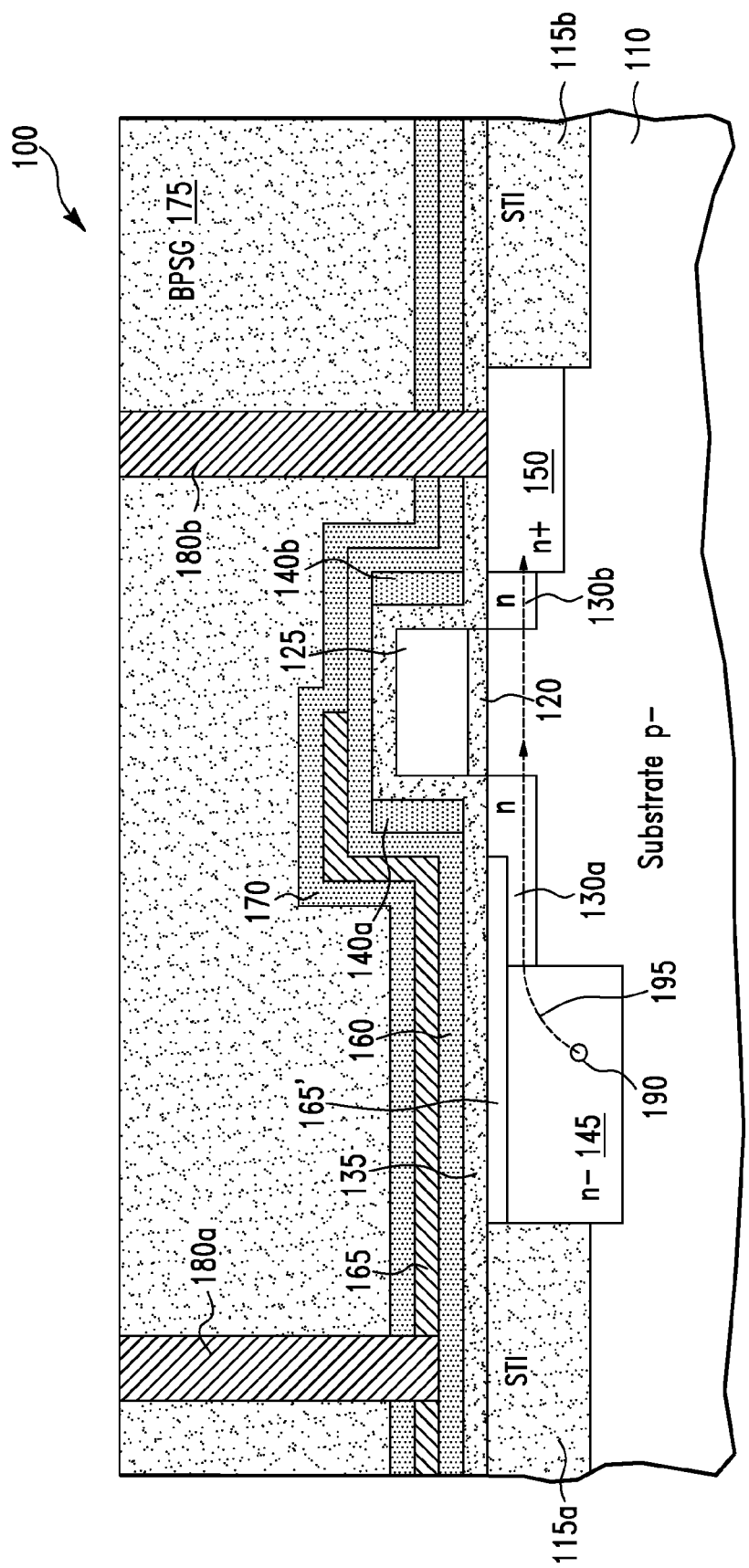

Next, with reference to FIG. 1M, in one embodiment, contacts 180a and 180b are formed in the structure 100 of FIG. 1L. Illustratively, the contacts 180a and 180b can be formed in turn by using a conventional method. In one embodiment, the contacts 180a and 180b comprise tungsten. In one embodiment, the contacts 180a and 180b are electrically coupled to the charge pushing region 165 and the floating diffusion region 150, respectively. In an alternative embodiment, before the contacts 180a and 180b are formed, liner layers (not shown) are formed on side walls and bottom walls of the trenches where the contacts 180a and 180b will be formed, respectively. It should be noted that a gate contact must be formed to give electrical access to the gate electrode region 125, but for simplicity, this contact is not shown in FIG. 1M. This contact can be seen in FIG. 1Ma as contact 180c.

FIG. 1Ma shows a top-down view of a CMOS sensor array 100.1 which comprises multiple CMOS sensors similar to the CMOS sensor 100 of FIG. 1M. More specifically, in FIG. 1Ma, in one embodiment, there are four CMOS sensors 100a, 100b, 100c, and 100d (similar to the CMOS sensor 100 of FIG. 1M) sharing two gate electrode regions 125a and 125b (similar to the gate electrode region 125 of FIG. 1M) and two charge pushing regions 165a and 165b (similar to the charge pushing region 165 of FIG. 1M). More specifically, the CMOS sensors 100a and 100c share the gate electrode region 125a and the charge pushing region 165a. Similarly, the CMOS sensors 100c and 100d share the gate electrode region 125b and the charge pushing region 165b. In one embodiment, the contact 180a is electrically coupled to the charge pushing region 165a.

FIG. 1Mb shows a top-down view of a CMOS sensor array 100.2 which comprises multiple CMOS sensors similar to the CMOS sensor 100 of FIG. 1M. In one embodiment, the CMOS sensor array 100.2 is similar to the CMOS sensor array 100.1 of FIG. 1Ma, except that the two charge pushing regions 165a and 165b of FIG. 1Ma are connected together to form one charge pushing region 165ab in FIG. 1Mb. In one embodiment, the contact 180a which is electrically coupled to the charge pushing region 165ab, can be formed outside the CMOS sensor array 100.2.

In one embodiment, FIG. 1Mc shows an operation of the CMOS sensor 100 of FIG. 1M. In general, the operation of the CMOS sensor 100 is as follows. First, a higher voltage is applied to the floating diffusion region 150, a lower voltage is applied to the substrate 110, and the transfer gate 155 is turned on. As a result, the photo diode 110,145 is reverse biased. Therefore, most free electrons in the photo diode 110,145 are pushed to the floating diffusion region 150 via the transfer gate 155. Then, the transfer gate 155 is turned off. Next, light is shined on the photo diode 110,145 momentarily. As a result, electron-hole pairs (not shown) are created in a depletion region (not shown) of the photo diode 110,145. The generated electrons remain preferentially in the depleted n− region 145 while the holes move to the depleted p− region 110. Next, the transfer gate 155 is turned on, and the charge pushing region 165 is electrically coupled to a pushing voltage which is lower than the voltage of the substrate 110. Therefore, most free electrons (e.g., an electron 190) in the depletion region (not shown) of the photo diode 110,145 are pushed to the floating diffusion region 150 along an electron path 195. The more the pushing voltage is lower than the voltage of the substrate 110, the more efficiently the photo-generated free electrons are pushed to the floating diffusion region 150. In one embodiment, when the charge pushing region 165 is electrically coupled to a pushing voltage, a virtual p-type pinning layer 165', specifically a hole inversion layer, is created in the n-Si region 145 and the extension region 140a. The virtual p-type pinning layer 165' (a) prevents the free electrons (e.g., the electron 190) from recombining near the top surface of the substrate 110 and thus lowering the signal strength, and (b) prevents interface states at the semiconductor surface from thermally generating electron-hole pairs (dark current) independently of the desired electron-hole pairs created by photon absorption.

Figure 2:
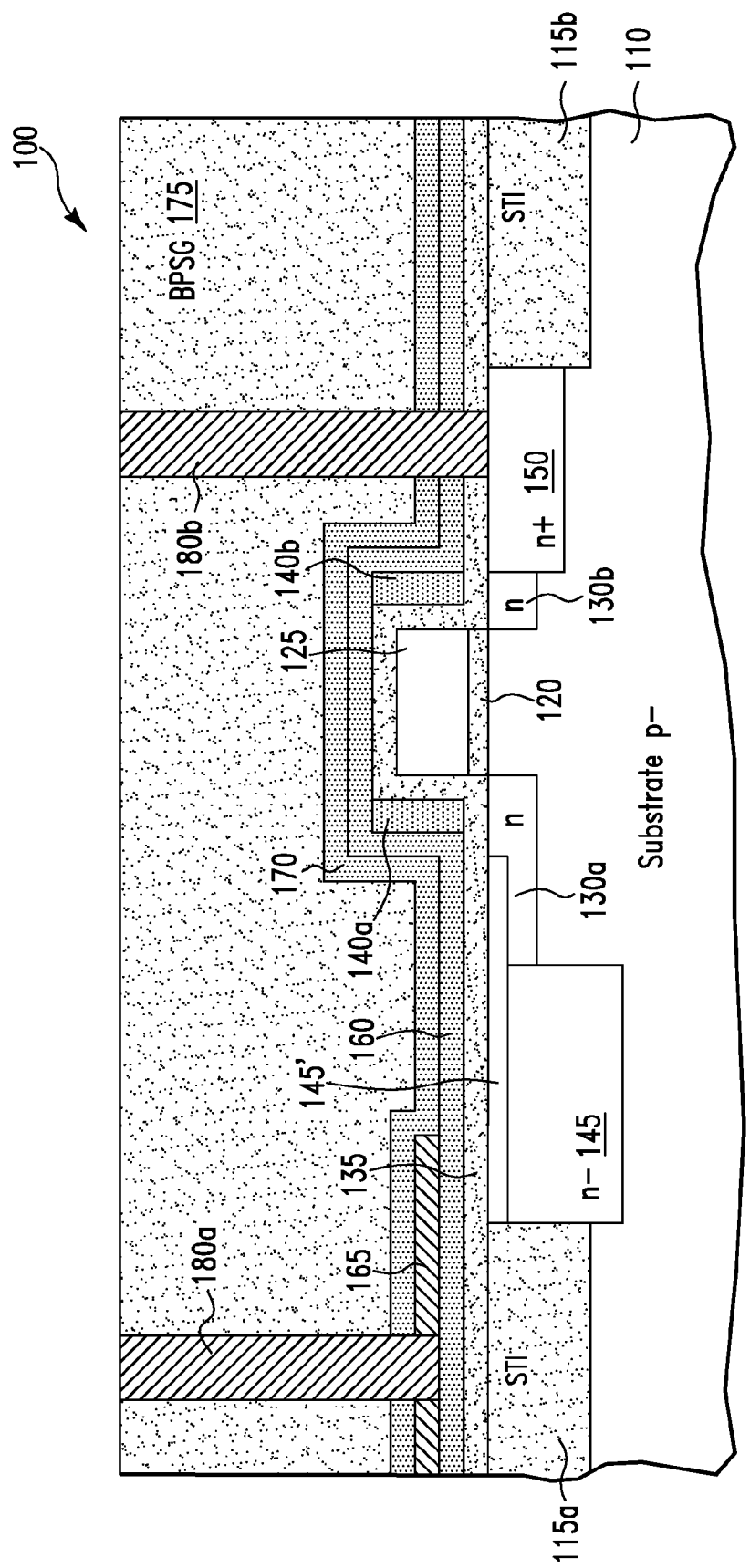
FIGS. 2-6 show other embodiments of the CMOS sensor of FIG. 1M, in accordance with embodiments of the present invention.

FIG. 2 shows a cross-section view of a CMOS sensor 200, in accordance with embodiments of the present invention. In one embodiment, the CMOS sensor 200 is similar to the CMOS sensor 100 of FIG. 1M, except that after the step of forming the n-Si region 145, a p+ region 145' (also called a pinning region 145') is formed in the substrate 110 by, illustratively, ion implantation (as shown in FIG. 2). In one embodiment, the p+ region 145' is implanted shallower than the extension regions 130a and 130b. The p+ region 145' prevents the free electrons (e.g., the electron 190 of FIG. 1Mc) from recombining with holes (not shown) which reside near the top surface of the substrate 110. In one embodiment, the charge pushing region 165 is formed only to the left of the transfer gate 155.

Figure 3:
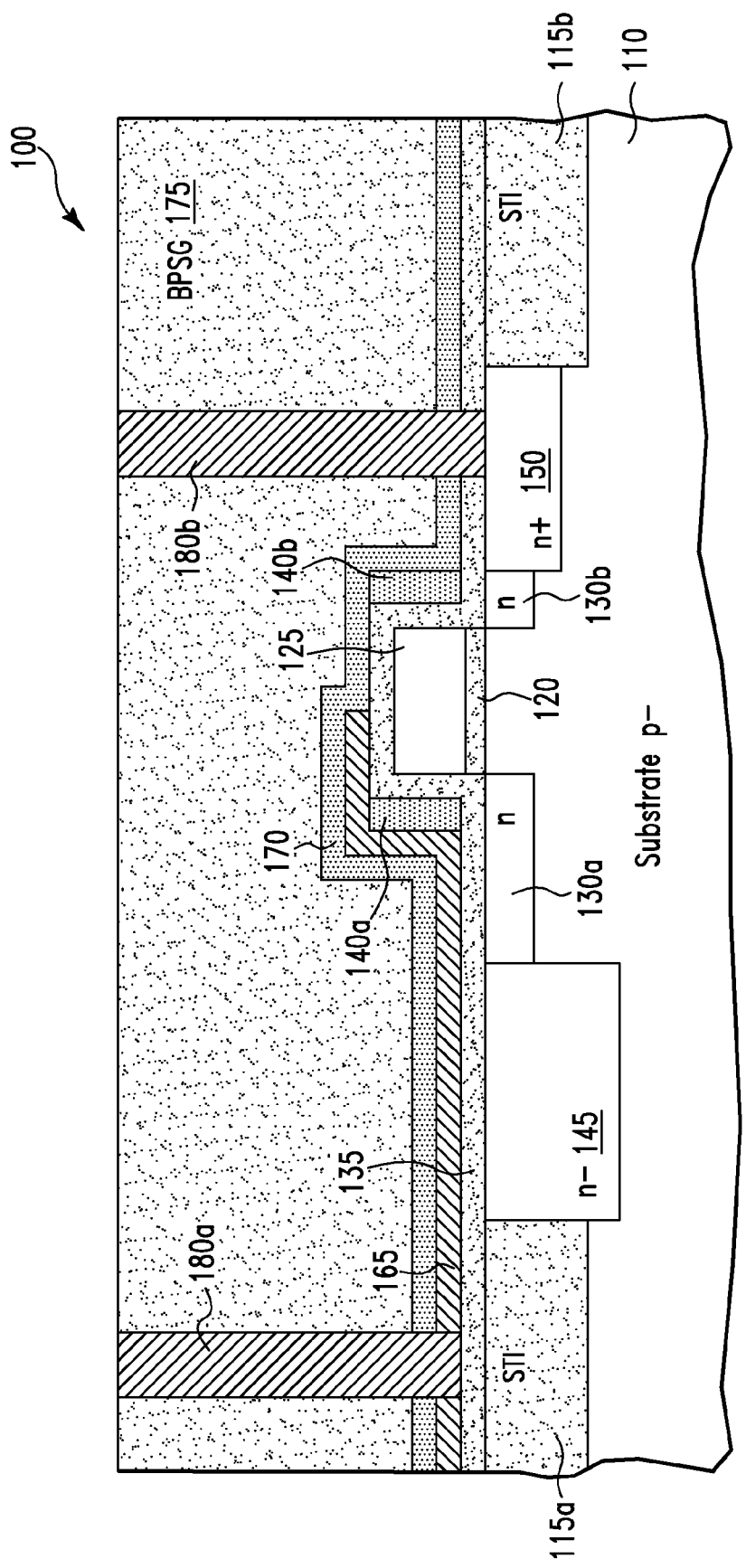

FIG. 3 shows a cross-section view of a CMOS sensor 300, in accordance with embodiments of the present invention. In one embodiment, the CMOS sensor 300 is similar to the CMOS sensor 100 of FIG. 1M, except that the nitride layer 160, which is present in structure 100 of FIG. 1M, is not present in the CMOS sensor 300 of FIG. 3. As a result, the charge pushing region 165 in FIG. 3 is closer to the n-Si region 145 than in FIG. 1.

Figure 4:
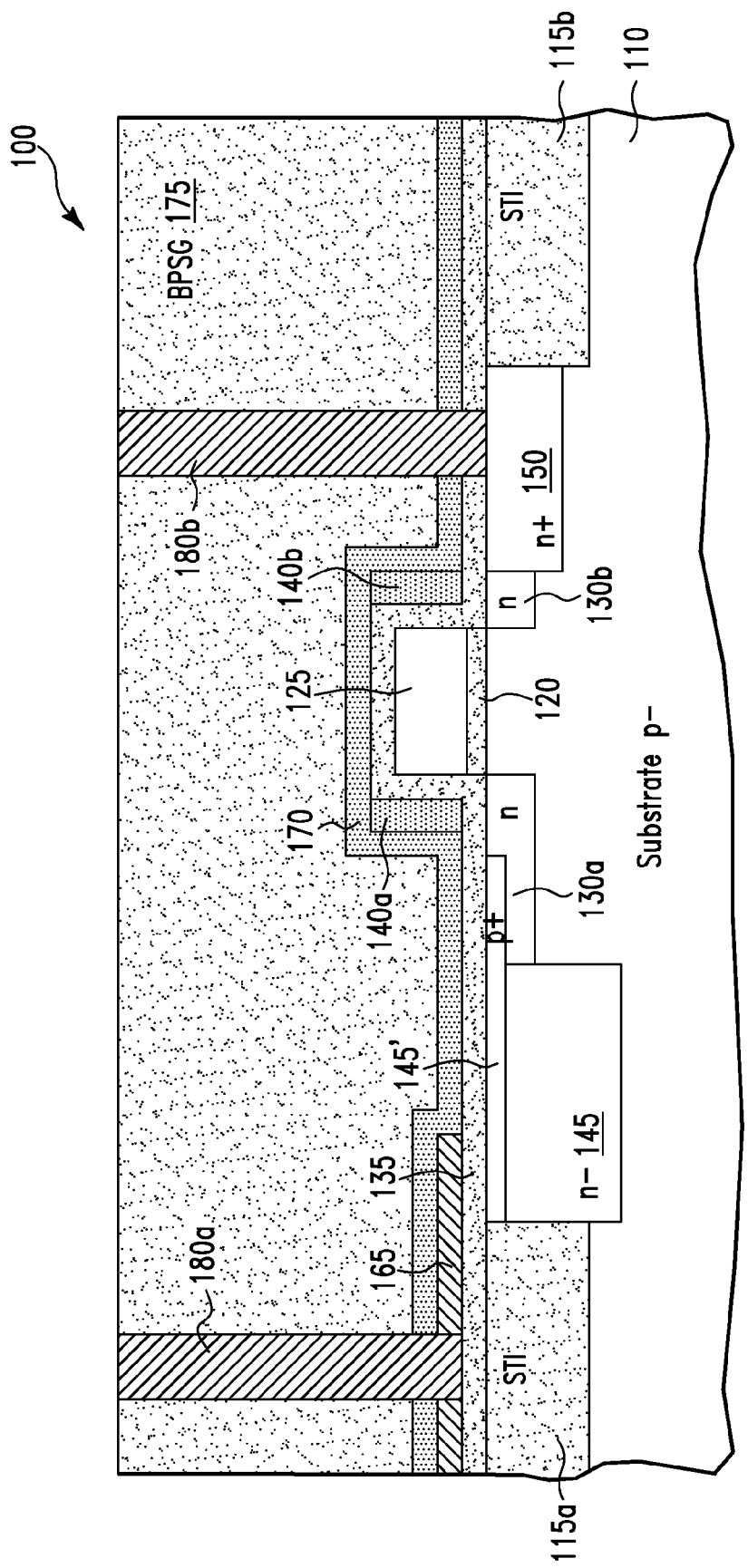

FIG. 4 shows a cross-section view of a CMOS sensor 400, in accordance with embodiments of the present invention. In one embodiment, the CMOS sensor 400 is similar to the CMOS sensor 300 of FIG. 3, except that after the step of forming the n-Si region 145, the p+ region 145' is formed in the substrate 110 by, illustratively, ion implantation (as shown in FIG. 4). In one embodiment, the p+ region 145' is implanted shallower than the extension regions 130a and 130b. The p+ region 145' prevents the free electrons (e.g., the electron 190 of FIG. 1Mc) from recombining with holes (not shown) which reside near the top surface of the substrate 110. In one embodiment, the charge pushing region 165 is formed only to the left of the transfer gate 155.

Figure 5:
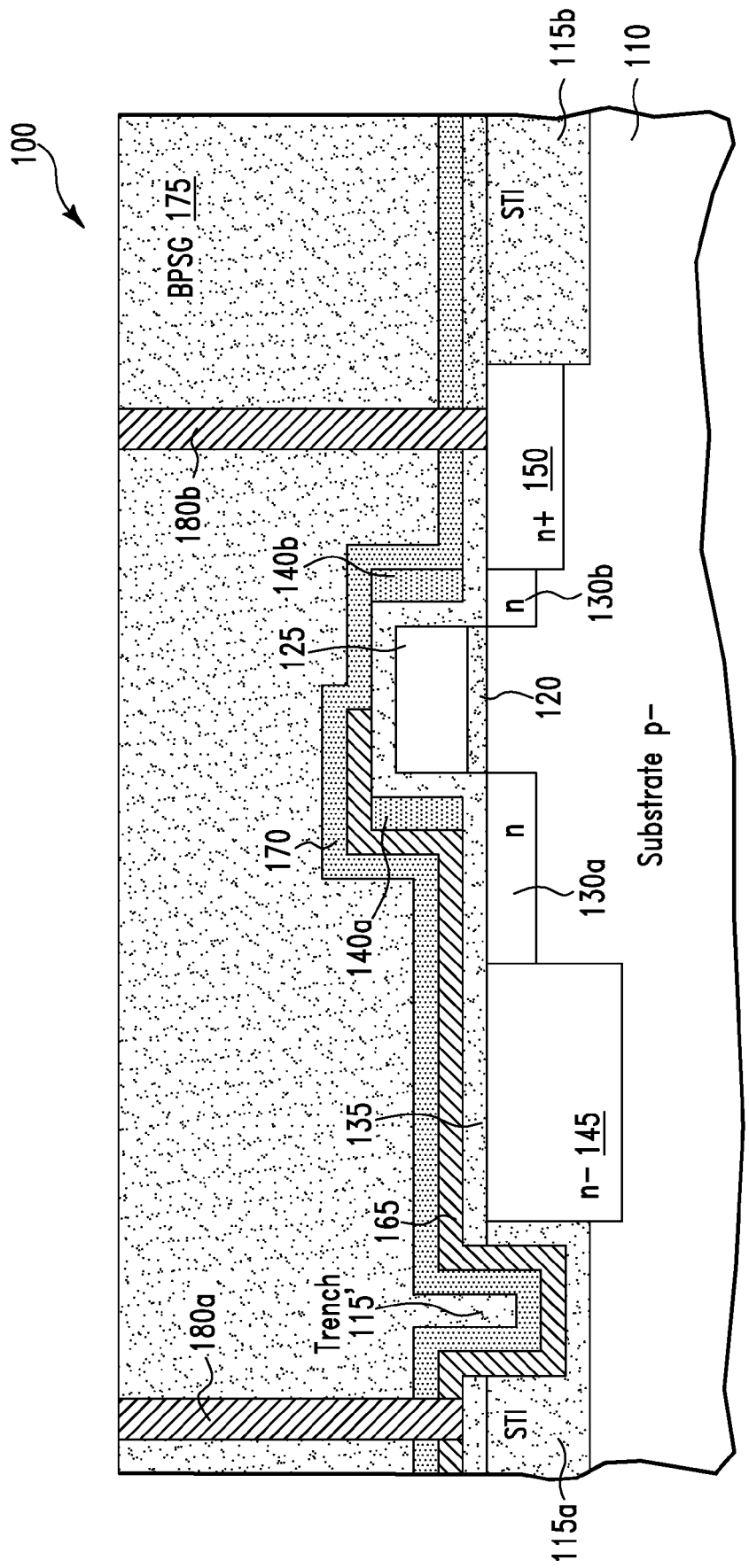

FIG. 5 shows a cross-section view of a CMOS sensor 500, in accordance with embodiments of the present invention. In one embodiment, the CMOS sensor 500 is similar to the CMOS sensor 300 of FIG. 3, except that after the step of forming the dielectric layer 135, a trench 115' is formed in the STI region 115a by using any conventional process (e.g., lithographic and then etching step). Therefore, in the ensuing steps of forming the charge pushing region 165 and the nitride layer 170, a portion of the charge pushing region 165 and a portion of the nitride layer 170, respectively, are formed on side walls and bottom walls of the trench 115'. As a result, the charge pushing region 165, when being applied a pushing voltage which is lower than the voltage of the substrate 110, helps push the free electrons (e.g., the electron 190 of FIG. 1Mc) toward the floating diffusion region 150 via the transfer gate 155.

Figure 6:
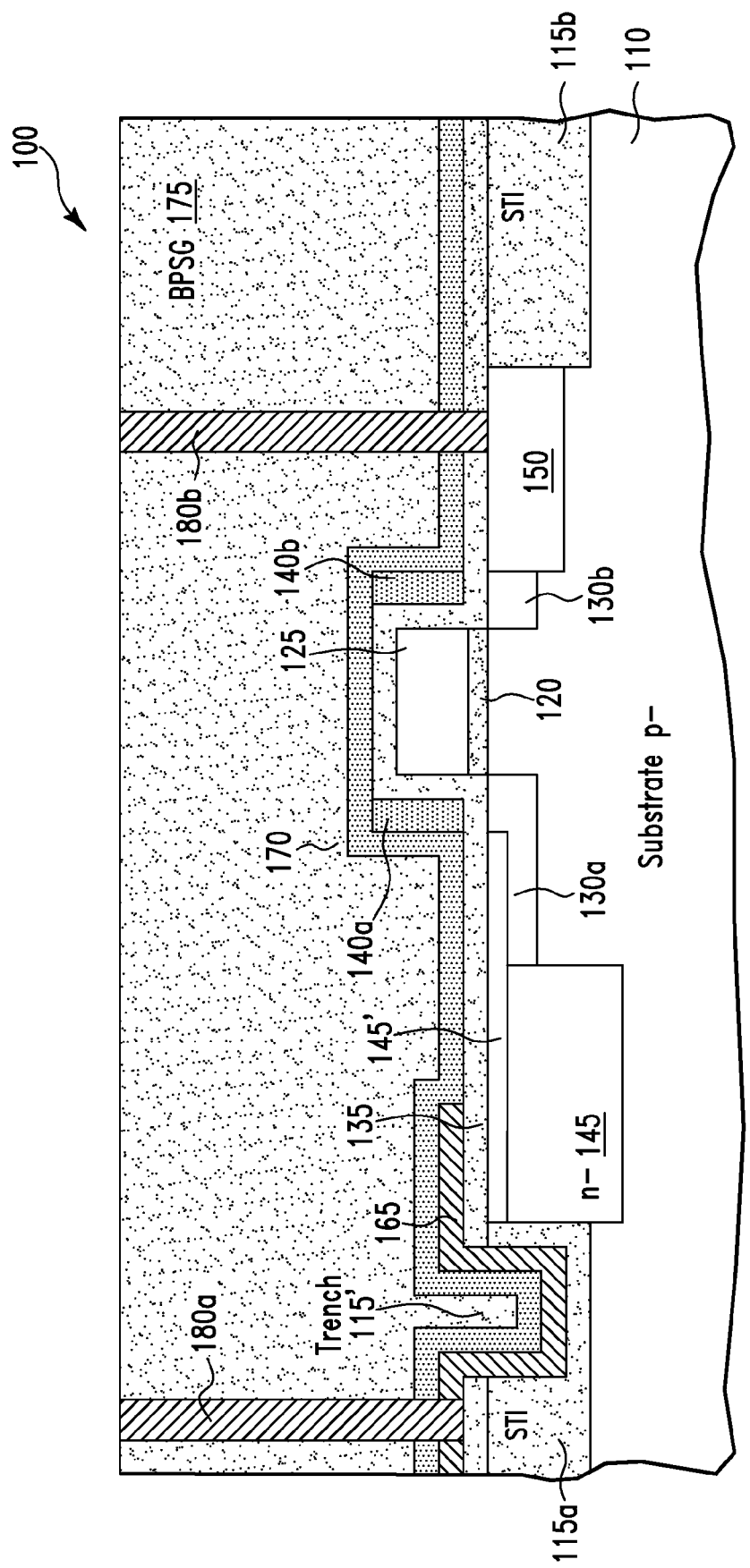

FIG. 6 shows a cross-section view of a CMOS sensor 600, in accordance with embodiments of the present invention. In one embodiment, the CMOS sensor 600 is similar to the CMOS sensor 500 of FIG. 5, except that after the step of forming the n-Si region 145, the p+ region 145' is formed in the substrate 110 by, illustratively, ion implantation (as shown in FIG. 6). In one embodiment, the p+ region 145' is implanted shallower than the extension regions 130a and 130b. The p+ region 145' prevents the free electrons (e.g., the electron 190 of FIG. 1Mc) from recombining with holes (not shown) which reside near the top surface of the substrate 110. In one embodiment, the charge pushing region 165 is formed only to the left of the transfer gate 155 as shown in FIG. 6.

While particular embodiments of the present invention have been described herein for purposes of illustration, many modifications and changes will become apparent to those skilled in the art. Accordingly, the appended claims are intended to encompass all such modifications and changes as fall within the true spirit and scope of this invention.

The invention claimed is:

1. A semiconductor structure, comprising:
   (a) a photo diode that includes a first semiconductor region and a second semiconductor region,
   wherein the first semiconductor region is doped with a first doping polarity,
   wherein the second semiconductor region is doped with a second doping polarity, and
   wherein the first and second doping polarities are opposite;
   (b) a transfer gate that comprises (i) a first extension region, (ii) a second extension region, and (iii) a floating diffusion region,
   wherein the first extension region is in direct physical contact with the photo diode, and
   wherein the second extension region is in direct physical contact with the floating diffusion region; and
   (c) a charge pushing region,
   wherein the charge pushing region overlaps the first semiconductor region,
   wherein the charge pushing region does not overlap the floating diffusion region, and
   wherein the charge pushing region comprises a transparent and electrically conducting material.

2. The structure of claim 1,
   wherein the floating diffusion region of the transfer gate is coupled to a first voltage,
   wherein the second semiconductor region is coupled to a second voltage,
   wherein the charge pushing region is coupled to a pushing voltage,
   wherein the first voltage is higher than the second voltage, and
   wherein the pushing voltage is lower than the second voltage.

3. The structure of claim 1, further comprising a first contact and a second contact electrically coupled to the charge pushing region and the floating diffusion region of the transfer gate, respectively.

4. The structure of claim 1, further comprising a first dielectric layer being sandwiched between the charge pushing region and the first semiconductor region of the photo diode, wherein the first dielectric layer comprises silicon dioxide.

5. The structure of claim 4, further comprising a second dielectric layer,
   wherein the second dielectric layer is on top and in direct physical contact with the first dielectric layer, and wherein the second dielectric layer comprises silicon nitride.

6. The structure of claim 1, wherein the charge pushing region overlaps the entire first semiconductor region of the photo diode.

7. The structure of claim 1, further comprising a pinning region,
wherein the pinning region is in direct physical contact with the first extension region of the transfer gate and the first semiconductor region of the photo diode, and
wherein the pinning region is doped with the second doping polarity.

8. The structure of claim 1, wherein a portion of the first semiconductor region of the photo diode is sandwiched between the first extension region and a portion of the charge pushing region.

9. A semiconductor structure operation method, comprising:
providing a semiconductor structure, which comprises:
(a) a photo diode that includes a first semiconductor region and a second semiconductor region,
wherein the first semiconductor region is doped with a first doping polarity,
wherein the second semiconductor region is doped with a second doping polarity, and
wherein the first and second doping polarities are opposite,
(b) a transfer gate that comprises (i) a first extension region, (ii) a second extension region, and (iii) a floating diffusion region,
wherein the first extension region is in direct physical contact with the photo diode, and
wherein the second extension region is in direct physical contact with the floating diffusion region, and
(c) a charge pushing region,
wherein the charge pushing region overlaps the first semiconductor region,
wherein the charge pushing region does not overlap the floating diffusion region, and
wherein the charge pushing region comprises a transparent and electrically conducting material;
shining light on the photo diode;
turning on the transfer gate; and
applying a first voltage to the floating diffusion region of the transfer gate, a second voltage to the second semiconductor region of the photo diode, and a pushing voltage to the charge pushing region so as to help push free electrons from the photo diode to the floating diffusion region through the transfer gate.

10. The method of claim 9,
wherein the first voltage is higher than the second voltage, and
wherein the pushing voltage is lower than the second voltage.

11. The method of claim 9,
wherein the semiconductor structure further comprises a first contact and a second contact, and
wherein the first and second contacts are electrically coupled to the charge pushing region and the floating diffusion region of the transfer gate, respectively.

12. The method of claim 9,
wherein the semiconductor structure further comprises a first dielectric layer,
wherein the first dielectric layer is sandwiched between the charge pushing region and the first semiconductor region of the photo diode, and
wherein the first dielectric layer comprises silicon dioxide.

13. The method of claim 12,
wherein the semiconductor structure further comprises a second dielectric layer,
wherein the second dielectric layer is on top and in direct physical contact with the first dielectric layer, and
wherein the second dielectric layer comprises silicon nitride.

14. The method of claim 9, wherein the charge pushing region overlaps the entire first semiconductor region of the photo diode.

15. The method of claim 9,
wherein the semiconductor structure further comprises a pinning region,
wherein the pinning region is in direct physical contact with the first extension region of the transfer gate and the first semiconductor region of the photo diode, and
wherein the pinning region is doped with the second doping polarity.

16. The method of claim 9, wherein a portion of the first semiconductor region of the photo diode is sandwiched between the first extension region and a portion of the charge pushing region.

17. A sensor array, comprising
(a) a substrate;
(b) N sensors on the substrate, wherein the N sensors are arranged in rows and columns, wherein each of the N sensors comprises:
(i) a photo diode that includes a first semiconductor region and a second semiconductor region,
wherein the first semiconductor region is doped with a first doping polarity,
wherein the second semiconductor region is doped with a second doping polarity, and
wherein the first and second doping polarities are opposite,
(ii) a transfer gate that comprises ($\alpha$) a first extension region, ($\beta$) a second extension region, and ($\gamma$) a floating diffusion region,
wherein the first extension region is in direct physical contact with the photo diode, and
wherein the second extension region is in direct physical contact with the floating diffusion region, and
(iii) a charge pushing region,
wherein the charge pushing region overlaps the first semiconductor region,
wherein the charge pushing region does not overlap the floating diffusion region, and
wherein the charge pushing region comprises a transparent and electrically conducting material,
(c) a contact contacting to first and second sensors of the N sensors.

18. The structure of claim 17, wherein the first and second charge pushing regions of the first and second sensors, respectively, are in direct physical contact with each other.

19. The structure of claim 17, wherein the contact is disposed between the first and second sensors.

20. The structure of claim 17, wherein the contact is not disposed between the first and second sensors.

* * * * *